United States Patent [19]

Iwasaki et al.

[11] 4,371,602
[45] Feb. 1, 1983

[54] PHOTOSENSITIVE PRINTING PLATE

[76] Inventors: Hidenori Iwasaki, 905, Ichinomiya, Samukawa-machi, Koza-gun, Kanagawa 253-01; Junichi Igarashi, 11-17, Denenchofu 2 chome, Ohta-ku, Tokyo 145; Shunichi Kasukawa, 3768, Fujisawa, Fujisawa-shi, Kanagawa 251, all of Japan

[21] Appl. No.: 170,670

[22] PCT Filed: Mar. 9, 1979

[86] PCT No.: PCT/JP79/00060

§ 371 Date: Nov. 13, 1979

§ 102(e) Date: Nov. 13, 1979

[87] PCT Pub. No.: WO79/00748

PCT Pub. Date: Oct. 4, 1979

[30] Foreign Application Priority Data

Mar. 13, 1978 [JP] Japan ................... 53-27614

[51] Int. Cl.$^3$ ............... G03C 1/60; G03C 1/71; G03F 7/08
[52] U.S. Cl. ................... 430/175; 430/152; 430/190; 430/191; 430/157; 430/165; 430/270; 430/281; 430/285; 430/286; 430/287; 430/290; 430/300
[58] Field of Search ............ 430/152, 175, 190, 191, 430/194, 195, 270, 286, 287, 290, 300, 285, 281, 165

[56] References Cited

U.S. PATENT DOCUMENTS

| | | | |
|---|---|---|---|
| 2,699,392 | 1/1955 | Herrick et al. | 430/152 |
| 2,996,381 | 8/1961 | Oster et al. | 430/152 |
| 3,093,478 | 6/1963 | Peterson et al. | 430/152 |
| 3,108,872 | 10/1963 | McMahon | 430/152 |
| 3,298,833 | 1/1967 | Gaynor | 430/290 |
| 3,482,973 | 12/1969 | Amidon | 430/290 |
| 3,507,678 | 4/1970 | Shimazu et al. | 430/510 |
| 3,594,166 | 7/1971 | Riebel et al. | 430/290 |
| 3,607,273 | 9/1971 | Kinney | 430/290 |
| 3,615,629 | 10/1971 | Wilhelm et al. | 430/917 |
| 3,891,443 | 6/1975 | Halpern et al. | 430/259 |
| 3,931,762 | 1/1976 | Fukushima et al. | |
| 4,019,909 | 4/1977 | Cohen et al. | 430/152 |
| 4,126,460 | 11/1978 | Okishi | 430/300 |
| 4,168,979 | 9/1979 | Okishi et al. | 430/162 |
| 4,188,222 | 2/1980 | Nezu et al. | 430/288 |
| 4,199,359 | 4/1980 | Weigl et al. | 430/308 |

FOREIGN PATENT DOCUMENTS

| | | |
|---|---|---|
| 2514213 | 10/1975 | Fed. Rep. of Germany . |
| 48-45304 | 6/1973 | Japan . |
| 49-105602 | 7/1974 | Japan . |
| 50-31488 | 11/1975 | Japan . |
| 51-24307 | 2/1976 | Japan . |
| 51-98505 | 8/1976 | Japan . |

OTHER PUBLICATIONS

Inoue, K., "I am Synthetic Paper", *Nikkan Kogyo Shimbun*, 10/1969, p. 131.
Kosar, J., "Light-Sensitive Systems", J. Wiley & Sons, 1965, pp. 175-178.
Chemical Abstracts, vol. 81, #144,274n, 1974.
Chemical Abstract, vol. 84, #97857e, 1976.

*Primary Examiner*—Charles L. Bowers
*Attorney, Agent, or Firm*—Armstrong, Nikaido, Marmelstein & Kubovcik

[57] ABSTRACT

The photosensitive printing plate of this invention features incorporation of an organic foaming agent in the photosensitive composition that constitutes the photosensitive layer, said organic foaming agent being thermally decomposed upon drying of said composition under heating to thereby roughen the surface of the photosensitive layer. According to this invention, no specific mechanical treatment is required for forming the photosensitive layer and also there is no need of remodeling the existing coating equipments, and further, the vacuum contact time can be appreciably lessened, so that this invention can greatly improve the working efficiency in plate making and markedly reduce the production cost.

4 Claims, 3 Drawing Figures

PHOTOSENSITIVE PRINTING PLATE

DESCRIPTION

Technical Field

This invention relates to a photosensitive printing plate, and more particularly it relates to an improvement in the photosensitive printing plate having a photosensitive resin layer on a support made of metal or other like material.

BACKGROUND ART

Generally, photosensitive printing plate is manufactured by coating the surface of the support such as aluminum plate, zinc plate, etc., with a photosensitive resin composition after roughening and making hydrophilic the support surface so as to intensify its adhesion to the photosensitive resin composition. The thus manufactured and commercially sold photosensitive printing plate is generally called PS plate.

Such photosensitive printing plate is smooth and flat on its surface, that is, the surface of the photosensitive layer formed from a photosensitive resin composition, so that when a flat original film is placed overlying said layer for effecting exposure and printing, it is found very difficult to purge air out of the space therebetween in a short period of time, and hence a long time would be required for bringing them into close contact with each other. Generally, the original film is placed on the photosensitive printing plate in a vacuum-type contact frame and the air trapped therebetween is sucked out by vacuum to bring them into close attachment. But since air usually stays in the form of independent cells in the non-peripheral areas of the two members, it would take long time to get rid of such air for ensuring close contact of said two members. If exposure is performed in an inperfect stage of contact, there can not be attained reproduction of a picture faithful to the original. For these reasons, reduction of the time required for attaining close contact has been a desideratum in the plate making industry.

As a solution to this problem, it was proposed to provide an uneven layer on the surface of the photosensitive printing plate. For instance, Japanese Patent Laid-Open Nos. 111102/76 and 29302/77 and U.S. Pat. No. 4,126,406 propose the methods for producing uneveness on the photosensitive layer surface by applying thereon a material which can be removed by a developing treatment. These methods, however, complicate the production process as one or more additional steps are involved, that is, the photosensitive composition is first applied on the support and, after drying thereof resin is printed thereon in an uneven pattern, followed by further drying.

Disclosure of Invention

The primary object of this invention is to provide, in an economically advantageous way, a photosensitive printing plate which allows reduction of the time required for effecting perfect attachment and detachment of the photosensitive printing plate and original film to greatly improve the working efficiency for plate making.

The photosensitive printing plate according to this invention is characterized in that a photosensitive composition containing a photosensitive resin and an organic foaming agent is applied on a support to form a photosensitive layer and then said organic foaming agent is thermally decomposed to roughen the surface of said photosensitive layer.

In a preferred form of photosensitive printing plate according to this invention, said organic foaming agent is at least one organic foamable compound selected from the nitroso, sulfonylhydrazine, azo and hydrazo compounds, and such organic foaming agent is contained in an amount of about 3 to 30% by weight based on the photosensitive resin.

In another preferred form of photosensitive printing plate according to this invention, said organic foaming agent is composed of an organic foamable compound and a thermal decomposition assistant, said assistant being contained in the ratio of about 30 to 60% by weight to the organic foamable compound.

A most salient advantage of this invention is that by merely incorporating an organic foaming agent in a photosensitive composition and without requiring addition of any extra step to the normal printing plate making process, there can be obtained a photosensitive printing plate which allows marked reduction of the time required for vacuum contact of the printing plate and original film and is also capable of reproducing a clear and sharp picture faithful to the original.

The "photosensitive printing plate" provided according to this invention includes all types of printing plates used for lithoprinting, relief printing and intaglio printing.

BEST MODE OF CARRYING OUT THE INVENTION

Figure 1:
FIG. 1 is a graph showing unevenness on the surface of a photosensitive printing plate obtained from Example 1 of this invention.

The organic foaming agent contained in the photosensitive composition used for forming a photosensitive printing plate according to this invention is one which is thermally decomposed to generate gas and roughens the photosensitive layer surface without giving any adverse effect to the properties of both photosensitive composition and photosensitive layer when said photosensitive layer formed from said photosensitive composition is dried under heating.

The organic foaming agent used in this invention may be selected from the organic foamable compounds including nitroso compounds, sulfonylhydrazine compounds which are the hydrazine derivatives of organic sulfonic acids, azo compounds and hydrazo compounds, which may be added with a thermal decomposition assistant.

Examples of the nitroso compounds usable as foaming agent in this invention include dinitrosopentamethylenetetramine, N, N'-dimethyl-N, N'-dinitrosoterephthalamide and trinitrosotrimethylenetriamine. Examples of the sulfonylhydrazine compounds include p-toluenesulfonylhydrazine, benzenesulfonylhydrazine, p, p'-oxybis (benzenesulfonylhydrazine), benzene-1, 3-disulfonylhydrazine, 3, 3'-disulfonylhydrazinediphenylsulfone, toluene-2, 4-disulfonylhydrazine and p, p'-thiobis (benzenesulfonylhydrazine). Examples of the azo compounds are azobisisobutyronitrile, azodicarboneamide (azobisformamide), azoaminobenzene and azocarboxylic acid diethylester (diethylazocarboxylate), and the examples of the hydrazo compounds include hydrazodicarbonamide, N, N'-dibenzoylhydrazine, β-acetylphenylhydrazine, Biurea and 1, 1-diphenylhydrazine.

All of these organic foamable compounds are decomposed upon heating to generate nitrogen gas. Some of these compounds produce small quantities of other gases than nitrogen gas, such as carbon monoxide, carbon dioxide and steam, but at least 60% of the whole produced gas is nitrogen gas. The amount of gas produced is approximately 100 to 300 ml/g.

The thermal decomposition temperature of these organic foamable compounds spans a wide range from about 80° C. to about 300° C.

These organic foamable compounds are decomposed and foamed when the photosensitive composition is heated and dried. It is essential that decomposition of such organic foamable compound is not attended by deterioration of the physical properties of the photosensitive layer, and the decomposition temperature must not be so high as to affect the photosensitive property of the photosensitive resin. Therefore, it needs to select a suitable organic foamable compound in accordance with the type of the photosensitive resin used. It is also possible to use an organic foaming agent formed by adding a thermal decomposition assistant in said compound so as to lower the decomposition temperature of the compound.

Preferred examples of thermal decomposition assistant usable in this invention are urea and urea derivatives, zinc white, lead carbonate, lead stearate and glycolic acids. Use of a metallic salt type assistant is undesirable as it may cause bleeding in the photosensitive layer surface. It is most desirable to use urea and its derivatives such as for example ureaethanolamine, guanylurea and aminoguanidine carbonates.

In the case of the organic foaming agents composed of an organic foamable compound and a thermal decomposition assistant, the desired effect can be obtained by adding the thermal decomposition assitant in the ratio of approximately 30 to 60% by weight to the organic foamable compound. The foaming agents of such blend are available on the market and used in other fields of industry, too. These commercially available organic foaming agents can be effectively used in the present invention.

As said before, the thermal decomposition temperature of the organic foamable compounds ranges from about 80° to 300° C. For example, the decomposition temperature of chemically pure azodicarbonamide is believed to be 230° C. However, such decomposition temperature may be lowered to around 120° C. by adding a thermal decomposition assistant. The decomposition temperatures of some examples of organic foaming agents composed of an organic foamable compound or such compound added with a thermal decomposition assistant are shown below:- dinitrosopentamethylenetetramine: 125°–250° C.; p-toluenesulfonylhydrazine: 90°–95° C.; p, p'-oxybis (benzenesulfonylhydrazine): 120°–140° C.; 3, 3'-disulfonylhydrazinediphenylsulfone: 145°–155° C.; azobisisobutylonitrile: 100°–115° C.; azodicarbonamide: 125°–200° C.

All types of known photosensitive resins may be used for the photosensitive composition which forms the photosensitive printing plate according to this invention. For instance, there may be used negative photosensitive resins such as polyvinyl cinnamate shown in Japanese Patent Publication No. 1492/63, its derivatives shown in U.S. Pat. No. 2,725,372, partially saponified polyvinyl acetate such as p-azidobenzoate and polyazidostyrene shown in British Pat. No. 843,541 and U.S. Pat. No. 3,096,311, diazo resin and acryl copolymer shown in Japanese Patent Laid-Open No. 30604/75, diazo resin and shellac mixture shown in Japanese Patent Publication No. 25841/75, and condensates of diethyl-p-phenylene diacrylate and 1, 4-di-β-hydroxyethylcyclohexane shown in U.S. Pat. Nos. 3,030,208, 3,622,320 and 3,453,237. It is also possible to use a positive photosensitive resin such as for example o-naphtho-quinonediazide shown in U.S. Pat. No. 3,046,120 and Japanese Patent Publication No. 24361/74.

The photosensitive composition forming the photosensitive layer of the photosensitive printing plate according to this invention contains a photosensitive resin and an organic foamable compound. In order to properly roughen the photosensitive layer surface, the organic foamable compound is preferably added in an amount of about 3 to 30% by weight, most preferably about 5 to 15% by weight, based on the photosensitive resin. The photosensitive composition coating build-up on the support is usually about 0.3 to 3 g/m$^2$, preferably about 0.5 to 2 g/m$^2$, based on dry weight.

Usually, direct coater, reverse coater or fountain coater is used for coating the photosensitive composition on the support, and heat drying of the photosensitive composition which is attended by thermal decomposition of the organic foaming agent is performed under the conditions which don't cause deterioration of the photosensitive layer properties, that is, at a temperature of about 90° to 250° C. for the period of 2 to 5 minutes.

For attaining quick purge of air from the space between the photosensitive layer surface of the photosensitive printing plate and the original film for obtaining vacuum contact of the printing plate with the original film, the difference of elevation on the roughened photosensitive layer surface should preferably be about 1 to 10 μm, the protuberance diameter about 2 to 20 μm and the inter-protuberance distance 0.1 to 1.5 mm. Such roughened surface can be obtained according to the photosensitive printing plate of this invention. When an organic foaming agent is used in an amount of about 5 to 15% by weight based on the photosensitive resin in this invention, there can be obtained a most favorable uneven rough surface with elevation difference of 2 to 4 μm and inter-protuberance distance of 0.2 to 0.7 mm.

The photosensitive printing plate according to this invention is described in further detail hereinbelow by way of embodiments thereof, but it is to be understood that these embodiments are by no means restrictive to the scope of the invention.

EXAMPLE 1

A 0.3 mm thick aluminum plate was degreased in a 55° C. 10% caustic soda solution for 30 seconds and washed well with water. Then the surface was roughened by a brush abrader made by Fuller Brush Co. (U.S.), washed with water, immersed in a 85°–90° C.

3% sodium silicate solution for 2 minutes for a silicate treatment, washed well with water and then dried.

The thus treated aluminum plate was coated with a photosensitive composition specified below by using a roll coater to provide a coating build-up of about 2 g/m² by dry weight, followed by drying in a 125°–135° C. atmosphere for 3 minutes by using a far infrared heater.

| Photosensitive composition | |
|---|---|
| Naphthoquinone-(1, 2)-diazido-5-sulfonyl chloride and phenol novolak condensate (photosensitive resin) | 5.0 gr |
| Ethylene glycol monobutyl ether | 15 gr |
| Oil Blue #603 (made by Orient Kagaku KK) | 0.05 gr |
| Cellmic CAP (an azodicarbonamide foaming agent mfd. by Sankyo Kasei KK) | 0.5 gr |

The surface of the thus obtained photosensitive layer was measured by a surface roughness and configuration meter (Surfcom Type 4 mfd. by Tokyo Seimitsu KK), the results being shown by a diagram in FIG. 1. FIG. 1 is a graphic representation magnified 50 times horizontally and 2,000 times vertically.

This photosensitive printing plate (800 mm×1,000 mm) was adapted in an automatic photo-composer (OTO Stepper KS-77 mfg. by OTOKO Machinery Corp.) in close contact with a positive original film and exposed by using a 2 kW ultra-high pressure mercury lamp. The vacuum contact time was set at 10 seconds.

When this photosensitive printing plate was developed by a 3% sodium metasilicate solution, a clear positive picture faithful to the positive original appeared distinctly on the support. By applying a fatty ink thereto, there was obtained an aluminum printing plate for lithographic printing.

By way of comparison, there was prepared a printing plate by following the completely same procedure as Example 1 except that no organic foaming agent was added to the photosensitive composition, but this printing plate was incapable of forming a clear picture faithful to the original. When plate making was performed by gradually increasing the time of vacuum contact between this comparative photosensitive printing plate and positive original film, a clear picture equal to that obtained in Example 1 could be obtained only when the vacuum contact time was made longer than 30 seconds.

EXAMPLE 2

A 0.3 mm thick photoengraving zinc plate was abraded and roughened on its surface with a nylon-made rotary brush by using abrasive sand, then washed with water and dried.

This surface-roughened zinc plate was coated with a below-defined photosensitive composition by a roll coater and dried by heating in a 120°–130° C. hot-air oven for 3 minutes to form a 3 g/m² photosensitive layer.

| Photosensitive composition | |
|---|---|
| Polyvinyl cinnamate (photosensitive resin shown in Japanese Pat. Pub. No. 1492/63) | 6 g |
| Ethylene glycol monomethyl ether acetate | 25 g |
| 5-Nitroacenaphthene | 0.5 g |
| Phthalocyanine blue-s-10 (mfd. by Dainichi Seika Kogyo) | 0.5 g |
| Cellmic AN (a dinitrosopentamethylenetetramine foaming agent mfd. by Sankyo Kasei) | 0.6 g |

The thus obtained photosensitive layer had the substantially same surface configuration as the photosensitive layer of Example 1. This photosensitive printing plate was vacuum contacted with a negative original film for 10 seconds by using the same machine as used in Example 1 and then exposed by using a 2 kW ultra-high pressure mercury lamp.

When this photosensitive printing plate was developed with a trichloroethylene solution, there was obtained a clear picture faithful to the original. This plate was then etched according to an ordinary Dow etching process to obtain a zinc relief.

By way of comparison, there was prepared a similar printing plate in the same way as Example 2 except for non-addition of the organic foaming agent to the photosensitive composition, but no clear picture faithful to the original could be obtained with this plate. In order to obtain a picture faithful to the original, vacuum contact time must be made longer than 30 seconds.

EXAMPLE 3

A 0.3 mm thick aluminum plate was surface-roughened after the manner of Example 1, then anodized in a 20% phosphoric acid solution, washed with water and dried.

The thus treated aluminum plate was coated with a photosensitive composition specified below by a roll coater to a coating build-up of 1 g/m² and then dried in a 125°–135° C. atmosphere by a far infrared heater for 3 minutes.

| Photosensitive composition | |
|---|---|
| Azido group-containing polymer (photosensitive resin shown in Example 3 of British Pat. No. 843,541) | 10 g |
| 4-oxo-4a-Azanaphthalene | 1.0 g |
| Cyclohexanone | 100 ml |
| Cellmic S (p, p'-oxybis (benzenesulfonylhydrazine foaming agent mfd. by Sankyo Kasei) | 1.0 g |

The thus obtained photosensitive layer had the substantially same surface configuration as the photosensitive layer of Example 1. This photosensitive printing plate was vacuum contacted (vacuum contact time: 10 seconds) with a negative original film in the completely same way as Example 1 and then exposed.

This photosensitive printing plate was then developed with cyclohexanone and the picture portion of a swollen state was dyed with a cyclohexanone solution of Methyl Violet to obtain a clear picture faithful to the original.

By way of comparison, there was prepared a similar printing plate in the same way as Example 3 except for non-addition of the organic foaming agent to the photosensitive composition, but no picture faithful to the original was obtained. Also, more than 30-second vacuum contact time was required for obtaining a faithful picture.

EXAMPLE 4

A 0.3 mm thick aluminum plate was surface-roughened after the manner of Example 1, anodized in a 15% sulfuric acid solution according to a known method, followed by washing with water and drying, then further immersed in a 70° C. 1% zirconium potassium fluoride solution for 3 minutes, washed with water and dried to perform a hydrophilization treatment.

The thus treated aluminum plate was coated with a photosensitive composition, shown below, by a roll coater to a coating build-up of 1 g/m² and then dried in a 120°–135° C. atmosphere by using a far infrared heater for 3 minutes.

| Photosensitive composition | |
|---|---|
| A 32% ethylene glycol monomethyl ether solution of poly (β-hydroxyethyl methacrylate) (photosensitive resin solution) | 24 g |
| p-Toluenesulfonic acid double salt of condensation product of paradiazodiphenylamine and formaldehyde | 1.5 g |
| Oil Blue #603 (made by Orient Kagaku) | 0.23 g |
| Ethylene glycol monomethyl ether | 60 g |
| Cellmic CAP-250 (an azodicarbonamide foaming agent mfd. by Sankyo Kasei) | 0.23 g |

The thus obtained photosensitive layer had the substantially same surface configuration as the photosensitive layer of Example 1. This photosensitive printing plate was vacuum contacted (vacuum contact time: 10 seconds) with a negative original film after the manner of Example 1 and then exposed.

When this photosensitive printing plate was developed with a developing solution of the following composition, there was obtained a clear picture faithful to the original.

| Developing solution | |
|---|---|
| Benzyl alcohol | 20 g |
| 40% Sodium silicate solution | 10 g |
| Monogen Y-100 (higher alcohol sufonic acid ester sodium mfd. by Daiichi Kogyo Seiyaku KK) | 30 g |
| Water | 940 g |

By way of comparison, there was prepared a similar printing plate in the same way Example 4 except that no organic foaming agent was added to the photosensitive composition, but no picture faithful to the original was obtained with this plate. For reproducing the picture true to the original, the vacuum contact time must be made longer than 30 seconds.

EXAMPLE 5

A 0.5 mm thick aluminum plate was subjected to a surface roughening treatment same as practiced in Example 1, then anodized in a 42% phosphoric acid solution, washed with hot water and dried.

This anodized aluminum plate was coated with the following photosensitive composition to a coating build-up of 2 g/m² and then dried in a 120°–130° C. atmosphere by using a far infrared heater.

| Photosensitive composition | |
|---|---|
| Ester-substituted polyester of diethyl-p-phenylene diacrylate and 1,4-di-β-hydroxyethoxycyclohexane (photosensitive resin) | 4.0 g |
| 2-benzoylmethylene-1-methyl-β-naphthothiazoline | 0.32 g |
| Benzoic acid | 0.16 g |
| Hydroquinone | 0.08 g |
| Monochlorobenzene | 100 ml |
| Cyanine Blue S-10 (mfd. by Dainichi Seika Kogyo) | 0.8 g |
| Cellmic CAP-149 (an azodicarbonamide foaming agent mfd. by Sankyo Kasei) | 0.4 g |

The thus obtained photosensitive layer had the substantially same surface configuration as the photosensitive layer of Example 1. The photosensitive printing plate was vaccum contacted (for 10 seconds) with a negative original in the same way as Example 1 and then exposed.

When this photosensitive printing plate was treated with the following developing solution, a clear picture faithful to the original could be reproduced.

| Developing solution | |
|---|---|
| 4-Butylolactone | 250 ml |
| Triethanolamine | 25 ml |
| Glycerol | 25 ml |
| Methylabietate | 2.5 ml |

In the case of the printing plate containing no foaming agent, more than 30-second vacuum contact time was required for reproducing a clear picture faithful to the original.

EXAMPLE 6

A 0.3 mm thick aluminum plate was surface-roughened and anodized after the manner of Example 5, then coated with the following photosensitive composition to a coating buildup of 2 g/m² and dried in a 200° C. atmosphere for 2 minutes.

| Photosensitive composition | |
|---|---|
| Naphthoquinone-(1, 2)-diazido-5-sulfonyl chloride and phenol novolak condensate | 5.0 g |
| Ethylene glycol monobutyl ether | 15 g |
| Oil Blue #603 (mfd. by Orient Kagaku) | 0.05 g |
| Cellmic No. 142 (a hydrazodicarbonamide foaming agent mfd. by Sankyo Kasei) | 0.5 g |

Figure 2:
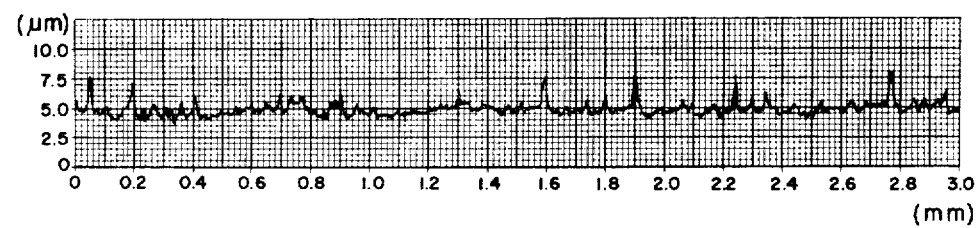
FIG. 2 is a graph showing surface unevenness of a photosensitive printing plate obtained from Example 6 of this invention.
Figure 3:
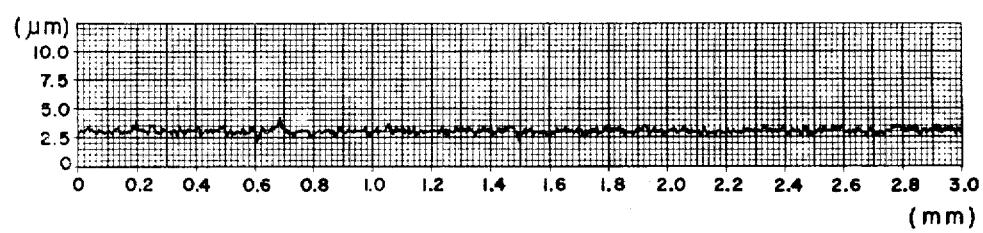
FIG. 3 is a graph showing surface smoothness of a photosensitive printing plate made by using the same composition as Example 1 except that no organic foaming agent is contained.

The thus obtained photosensitive layer had a surface configuration such as shown in FIG. 2. This photosensitive printing plate was vacuum contacted (vacuum contact time: 10 seconds) with a positive original film in the completely same manner as Example 1 and then exposed.

When this photosensitive printing plate was developed with a 3% sodium metasilicate solution, there was obtained a clear and sharp picture faithful to the positive original, and it was found that no adverse effect was given to the photosensitive layer by the foaming agent and the foaming treatment.

By way of comparison, there was prepared a similar printing plate in the completely same way as Example 6 except that no organic foaming agent was added to the photosensitive composition, but no clear picture faithful to the original was formed with this plate. When plate making was performed by gradually increasing the vacuum contact time between this comparative photosensitive printing plate and the positive original film, a clear picture same as provided in Example 6 could be obtained only when the vacuum contact time was set at 30 seconds.

Industrial Applicability

This invention makes it possible to roughen the surface of the photosensitive layer coated on the support in a PS plate with no need of any extra step in the plate making process. This allows completion of vacuum contact between photosensitive printing plate and original film in a short period of time and also makes it possible to obtain a clear and sharp picture faithful to the original. Thus, the plate making efficiency is markedly improved and the production cost is reduced. This invention, therefore, is of great value in the plate making industry.

What is claimed is:

1. A photosensitive printing plate comprising a support and a photosensitive layer coated thereon, the photosensitive layer having a roughened surface especially suitable for vacuum contact of a negative thereon, the layer comprising a photosensitive composition containing a photosensitive resin and one or more organic foaming agents in an amount of approximately 3 to 30% by weight based on the photosensitive resin and wherein said organic foaming agent is thermally decomposed prior to exposure to light to produce a gas, thereby roughening the surface of said photosensitive layer;

said resin is selected from the group consisting of polyvinyl cinnamate, derivatives of polyvinyl cinnamate, partially saponified polyvinyl acetate, diazo resin with acrylic copolymer, diazo resin and shellac mixture, condensates of diethyl-p-phenylene diacrylate, condensates of 1,4-di-$\beta$-hydroxyethyl-cyclohexane, and o-naphtho-quinonediazide; and said organic foaming agent is selected from the group consisting of dinitrosopentamethylenetetramine, N,N'-dimethyl-N,N'-dinitrosoterephthalamine, trinitrosotrimethylenetriamine, p-toluenesulfonylhydrazine, benzenesulfonylhydrazine, p,p'-oxybis(benzenesulfonylhydrazine), benzene-1,3-disulfonylhydrazine, 3,3'-disulfonylhydrazinephenylsulfone, toluene-2,4-disulfonylhydrazine, p,p'-thiobis(benzenesulfonylhydrazine), azobisisobutyronitrile, azodicarboneamide(azobisformamide), azoaminobenzene, azocarboxylic acid diethylester (diethylazocarboxylate), hydrazodicarbonamide, N,N'-dibenzoyl-hydrazine, $\beta$-acetylphenylhydrazine, biurea, and 1,1-diphenylhydrazine.

2. A photosensitive printing plate according to claim 1 wherein said organic foaming agent further contains a thermal decomposition assistant added in an amount of approximately 30 to 60% by weight based on the organic foaming agent.

3. A photosensitive printing plate according to claim 2 wherein said thermal decomposition assistant is selected from the group consisting of urea, urea derivatives, zinc white, lead carbonate, lead stearate, and glycolic acids.

4. A photosensitive printing plate comprising a support and a photosensitive layer coated thereon, the photosensitive layer having a roughened surface especially suitable for vacuum contact of a negative thereon, the layer comprising a photosensitive composition containing a photosensitive resin and one or more organic foaming agents in an amount of approximately 3 to 30 % by weight based on the photosensitive resin and wherein said organic foaming agent is thermally decomposed prior to exposure to light to produce a gas, thereby roughening the surface of said photosensitive layer;

said organic foaming agent containing an organic foamable compound selected from the group consisting of dinitrosopentamethylenetetramine, N,N'-dimethyl-N,N'-dinitrosoterephthalamide, trinitrosotrimethylenetriamine, p-toluenesulfonylhydrazine, benzenesulfonylhydrazine, p,p'-oxybis(benzenesulfonylhydrazine), benzene-1,3-disulfonylhydrazine, 3,3'-disulfonylhydrazinephenylsulfone, toluene-2,4-disulfonylhydrazine, p,p'-thiobis(benzenesulfonylhydrazine), azobisisobutyronitrile, azodicarboneamide (azobisformamide), azoaminobenzene, azocarboxylic acid diethylester (diethylazocarboxylate), hydrazodicarbonamide, N,N'-dibenzoylhydrazine, $\beta$-acetylphenylhydrazine, biurea, and 1,1-diphenylhydrazine, and a thermal decomposition assistant in an amount of approximately 30 to 60% by weight based on the organic foamable compound, said thermal decomposition assistant being selected from the group consisting of urea, urea derivatives, zinc white, lead carbonate, lead stearate and glycolic acids.

* * * * *